(12) United States Patent
Lin et al.

(10) Patent No.: US 7,800,520 B2
(45) Date of Patent: Sep. 21, 2010

(54) METHOD AND SYSTEM FOR ENTROPY CODING

(75) Inventors: Ken Kengkuan Lin, Redwood City, CA (US); Mitchell Howard Oslick, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 22 days.

(21) Appl. No.: 12/346,413

(22) Filed: Dec. 30, 2008

(65) Prior Publication Data

US 2009/0103608 A1   Apr. 23, 2009

Related U.S. Application Data

(63) Continuation of application No. 11/734,938, filed on Apr. 13, 2007, now Pat. No. 7,486,211.

(51) Int. Cl.
  *H03M 7/40*  (2006.01)
(52) U.S. Cl. .................. 341/67; 341/65; 341/66; 341/106; 341/107
(58) Field of Classification Search .......... 341/65, 341/66, 67, 106, 107; 375/E7.138, E7.244, 375/E7.279
See application file for complete search history.

(56) References Cited

U.S. PATENT DOCUMENTS

| | | | |
|---|---|---|---|
| 5,710,561 A | 1/1998 | Schmidt et al. | |
| 5,798,718 A | 8/1998 | Hadady | |
| 5,818,363 A | 10/1998 | Kim | |
| 5,831,559 A * | 11/1998 | Agarwal et al. | 341/106 |
| 5,926,576 A * | 7/1999 | Newton | 382/247 |
| 6,011,499 A | 1/2000 | Agarwal et al. | |
| 6,049,633 A * | 4/2000 | Cho | 382/247 |
| 6,118,392 A * | 9/2000 | Levine | 341/60 |
| 6,140,944 A | 10/2000 | Toyoyama | |
| 6,166,664 A * | 12/2000 | Acharya | 341/63 |
| 6,484,142 B1 | 11/2002 | Miyasaka et al. | |
| 6,505,320 B1 | 1/2003 | Turk et al. | |
| 6,711,295 B2 * | 3/2004 | Nakayama et al. | 382/232 |
| 6,778,483 B2 | 8/2004 | Mouri et al. | |
| 6,987,468 B1 | 1/2006 | Malvar | |
| 7,015,837 B1 | 3/2006 | Malvar | |
| 7,068,192 B1 | 6/2006 | Dean et al. | |
| 7,113,115 B2 | 9/2006 | Partiwala et al. | |
| 7,245,235 B2 | 7/2007 | Malvar | |
| RE39,984 E * | 1/2008 | Kajiwara | 382/239 |
| 2003/0137438 A1 | 7/2003 | Yokose | |
| 2005/0015249 A1 | 1/2005 | Mehrotra et al. | |

(Continued)

OTHER PUBLICATIONS

David Salomon, "Data Compression: The Complete Reference," 3rd Edition, Jan. 1, 2004, Springer Verlag, New York, NY, US, pp. 168-171, XP002567706, pp. 51-53, p. 52, line 1 - p. 53, line 3.

(Continued)

*Primary Examiner*—Linh V Nguyen
(74) *Attorney, Agent, or Firm*—Kenyon & Kenyon LLP

(57) ABSTRACT

A method and system are provided for encoding a plurality of integers with variable-length code tables constructed by combining a plurality of structured code tables. Each code table has an associated set of integer values; the sets are disjoint and exhaustive, so that every integer appears in exactly one set. An integer is encoded using the codebook associated with the set in which the integer appears.

21 Claims, 4 Drawing Sheets

U.S. PATENT DOCUMENTS

2007/0233076 A1 10/2007 Trieu
2008/0144717 A1* 6/2008 Zhu et al. .............. 375/240.16
2009/0256730 A1 10/2009 Patel

OTHER PUBLICATIONS

Y. Itoh et al., "Universal Variable Length Code for DCT Coding," Image Processing, 2000. Proceedings. 2000 International Conference on Sep. 10-13, 2000, IEEE, Piscataway, NJ, USA, vol. 1, Sep. 10, 2000, pp. 940-943, XP010530771, ISBN: 978-0-7803-6297-0, Figure 1; Tables 1, 2.

E.C. Reed et al., "Efficient Coding of DCT Coefficients by Joint Position-Dependent Encoding," Acoustics, Speech and Signal Processing, 1998. Proceedings of the 1998 IEEE International Conference in Seattle, WA, USA, May 12-15, 1998, New York, NY, USA, IEEE, US, vol. 5, May 12, 1998, pp. 2817-2820, XP010279416, ISBN: 978-0-7803-4428-0, p. 2817, left-hand column, line 13; right-hand column, line 16.

Marcelo J. Weinberger et al., "The LOCO-I Lossless Image Compression Algorithm: Principles and Standardization into JPEG-LS," IEEE Transactions on Image Processing, IEEE Service Center, Piscataway, NJ, US, vol. 9, No. 8, Aug. 1, 2000, XP011025643, ISSN: 1057-7149, p. 1316, right-hand column, line 8-line 46.

* cited by examiner

METHOD AND SYSTEM FOR ENTROPY CODING

RELATED APPLICATIONS

This application is a continuation of patent application Ser. No. 11/734,938 filed on Apr. 13, 2007.

BACKGROUND

Various encoding schemes are known for encoding a video or sequence of pictures. The video may include a plurality of pictures, each picture sub-divided into a plurality of slices. Each slice includes a plurality of 8×8 pixel blocks. For example, encoding schemes may be discrete cosine transform-("DCT") based, which transforms blocks into 8×8 matrices of coefficients. The DCT coefficient matrix for each block is then quantized with a quantizer parameter, reducing some coefficients to zero. The quantized coefficient matrix is scanned in a pre-defined pattern, and the result is stored in a one-dimensional array.

The one-dimensional array is encoded with standard run-level encoding, where each group of consecutive zeros and subsequent non-zero value in the array is replaced with a run-level code. Additional encoding may be applied, resulting in a bit stream. The bit stream can be transmitted and decoded into a sequence of pictures similar to the encoded sequence of pictures. Because coefficients were quantized in the quantization step, some picture information is lost and not recovered in the decoding process.

Entropy encoders are known in the art. For example, Golomb-Rice and exponential Golomb codes are families of entropy codes that are indexed by a non-negative integer value (called an "order"). Both code families include non-negative integers as their symbol alphabets. Furthermore, both code families output codewords consisting of three parts: a unary prefix consisting solely of zero bits, a separator consisting of a single one bit and a binary suffix. If the prefix has q bits, the separator is a single bit and the suffix is k bits, the length of an individual code is q+k+1.

To encode a non-negative integer n using a Golomb-Rice code of order k, known coders first calculate the quotient and remainder of n with respect to $2^k$, $q=floor(n/2^k)$ and $r=n \mod 2^k$. These calculations are trivial: r corresponds to the k least-significant bits of the binary representation of n, and q corresponds to the other, most-significant, bits. Then the codeword for n consists of q zero bits, a single one bit, and k bits containing the binary representation of r; the length of the codeword is clearly q+1+k.

The exponential Golomb codes have a slightly more complex structure. For these the number of zero bits in the code prefix is $q=floor(log_2(n+2^k))-k$, where again n is a non-negative integer being encoded and k is the code order. The length of the suffix is q+k. As it happens, rather than specifying its suffix, the codeword is most easily obtained directly as the binary representation of the sum $n+2^k$, zero-extended by q bits for a total codeword length of q+1+q+k=2q+k+1. In these calculations, $floor(log_2(n+2^k))$ is not difficult to compute; if the minimal-length binary representation of $n+2^k$ requires b bits, then $floor(log_2(n+2^k))$ is simply b−1.

Golomb-Rice codes and exponential Golomb codes are each well-suited for distinct source distributions. However, a need exists for a structured coding scheme that can efficiently encode source distributions that cannot be efficiently encoded by either Golomb-Rice or exponential Golomb codes.

DETAILED DESCRIPTION

An improved coding scheme reduces a size of the bit stream associated with an encoded video. Thus, the bit stream may be transmitted with less bandwidth, or the video may be encoded with less quantization while still requiring the same bandwidth (thereby improving video quality). A method and system are provided to minimize the size of bit streams associated with encoded frames by using a new codebook scheme. An entropy encoding unit receives a one-dimensional array from a scanning unit after the DCT coefficient matrix has been quantized, scanned, and run-level encoded. The entropy encoding unit then encodes small values with Golomb-Rice codes and large values with exponential Golomb codes.

Figure 1:
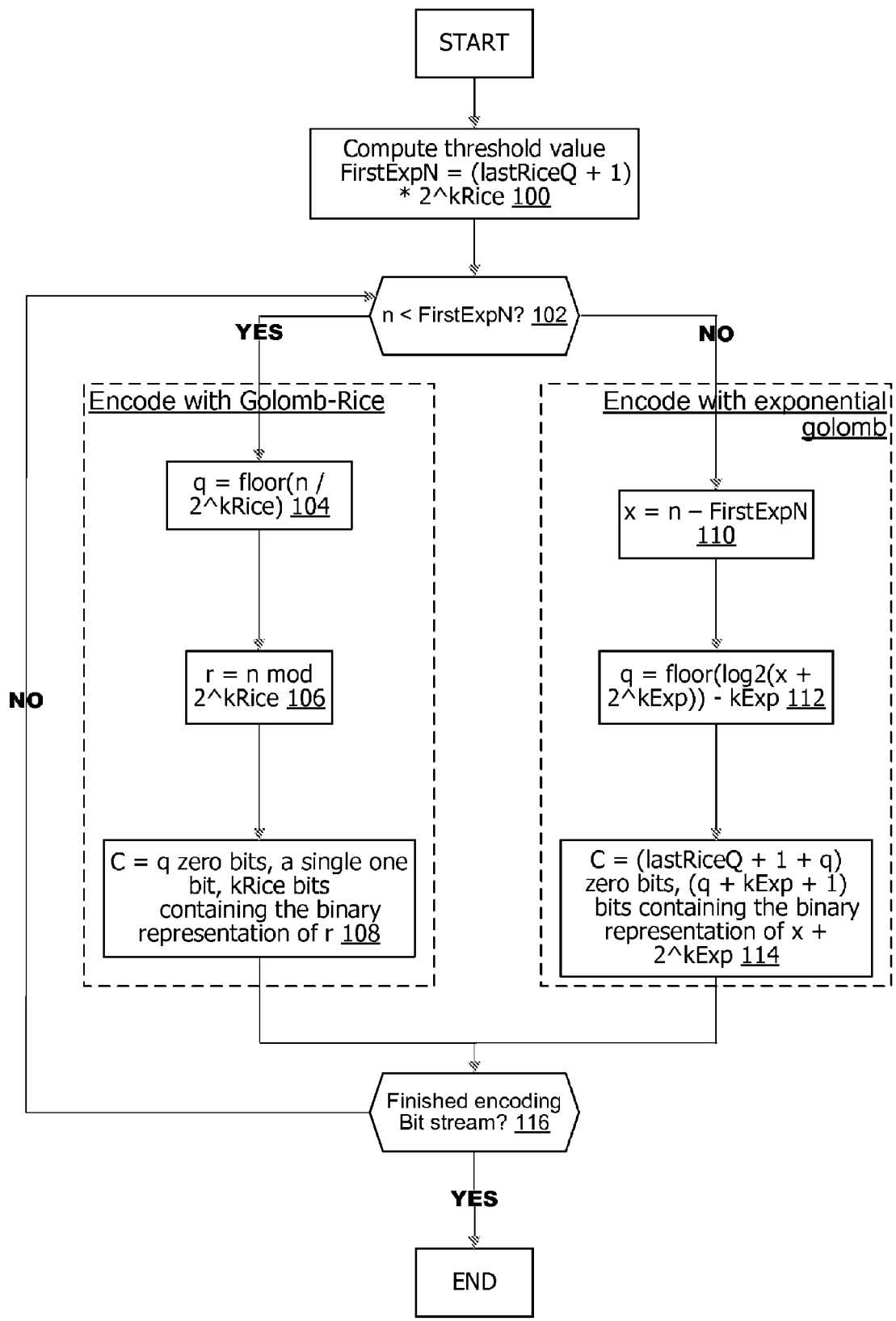
FIG. 1 illustrates a procedure for encoding a bit stream according to an embodiment of the present invention.
Figure 2:
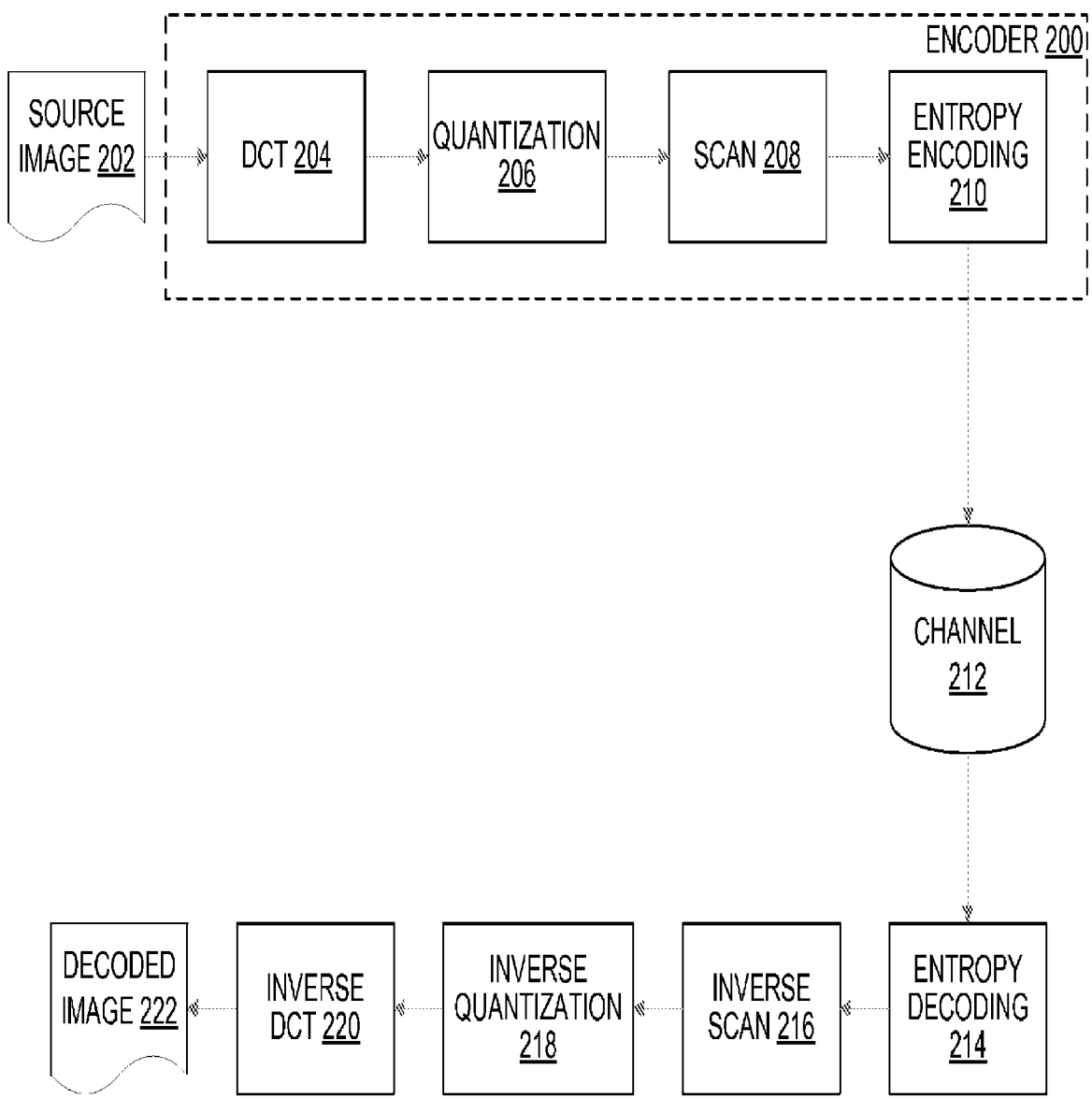
FIG. 2 illustrates an encoder according to an embodiment of the present invention.

FIG. 1 illustrates a procedure for encoding a bit stream according to an embodiment of the present invention. The procedure may be executed on an entropy encoding unit of an encoder as depicted in FIG. 2. At start, the procedure may receive a one-dimensional array of integers from a scanning unit, the one-dimensional array representing a bit stream to be further encoded. For example, the one-dimensional array may be a result of run-level encoded two-dimensional array of quantized coefficients that were scanned in a pre-defined pattern.

The one-dimensional array of integers received by the entropy coding unit is compressed with a combination code based on the Golomb-Rice and exponential Golomb codes. For small values in the array, Golomb-Rice codes are used. For large values, exponential Golomb codes are used. Switching among the code families is impliedly signaled between an encoder and a decoder according to codewords produced by encoding previous data. Within the encoder and decoder, each unit manages selection of appropriate code families using three parameters: an order of an associated Golomb-Rice code (called "kRice" herein), an order of an associated exponential Golomb code (called "kExp"), and a switch value indicating when to switch between the two types of codes.

In 100, a threshold value is calculated as FirstExpN=(lastRiceQ+1) * $2^{kRice}$, where lastRiceQ is the largest value of q for which the Golomb-Rice code still applies. For example, lastRiceQ may be chosen to maximize compression efficiency of the encoding scheme with regards to a source distribution.

In 102, the entropy encoding unit tests whether n is smaller than FirstExpN. A value n to be encoded is selected from the one-dimensional array, for example, a first un-encoded value. Values less than FirstExpN are encoded with a Golomb-Rice code. Values greater than or equal to FirstExpN are encoded with a modified exponential Golomb code.

If yes, n is a small value to be encoded with a Golomb-Rice code and the procedure proceeds to 104. If no, n is to be encoded with an exponential Golomb code and the procedure proceeds to 110. In FIG. 1, the left side of the flowchart indicates a sub-procedure to encode n with a Golomb-Rice code. The right side of the flowchart indicates a sub-procedure to encode n with an exponential Golomb code.

Steps 104, 106, and 108 are a sub-procedure for encoding n with a Golomb-Rice code. In 104, a quotient q is calculated with respect to $2^k$, $q = \text{floor}(n/2^k)$. In 106, a remainder r is calculated as $r = n \bmod 2^k$, r corresponds to the k least-significant bits of the binary representation of n, and q to the remaining most-significant bits. In 108, the codeword C representing n consists of q zero bits, a single one bit, and k bits containing the binary representation of r. The length of C is q+1+k.

Steps 110, 112, and 114 are a sub-procedure for encoding n with an exponential Golomb code. In 110, x is calculated as x=n−FirstExpN. In 112, the number of zero bits in the code prefix is calculated as $q = \text{floor}(\log_2 (x+2^k)) - k$, where k is the code order. If the minimal-length binary representation of $x+2^k$ requires b bits, then $\text{floor}(\log_2 (x+2^k))$ is simply b−1. In 114, the codeword C is (lastRiceQ+1+q) zero bits followed by (q+k+1) bits containing the binary representation of $x+2^k$.

In 116, the entropy encoding unit tests whether all values from the one-dimensional array have been encoded. If yes, the procedure ends and each codeword C representing a corresponding encoded n is outputted to a channel as a bit stream. If no, the procedure returns to 100, where a next value n will be encoded.

It will be appreciated that during decoding, a crossover point where the coding scheme changes can be calculated as follows: if an encoded value begins with lastRiceQ or fewer zero bits, an order-kRice Golomb-Rice codeword is decoded. If not, the first lastRiceQ+1 zero bits are ignored, then an order-kExp exponential Golomb codeword is decoded, and FirstExpN is added.

There are several ways for the decoder to know what codebook (kRice, firstRiceQ, and kExp) to use. The codebook can be fixed and built in the system, so both encoder and decoder use the same codebook. The codebook can also be sent as side information from the encoder to the decoder. Finally, if both encoder and decoder follow the same adaptation rule, the codebook to use for the next codeword is a function of previous codewords, which the decoder has already decoded.

FIG. 2 illustrates an encoder according to an embodiment of the present invention. The encoder 200 may be implemented in hardware or software and receives a source image 202, a digital image. For example, the source image 202 may be a picture from a frame as described below. It should be understood that the encoder 200 may also receive a video, where each picture making up the video will be encoded.

The source image 202 is first transformed by a discrete cosine transform ("DCT") unit 204. The transform converts spatial variations into frequency variations and produces an array of transform coefficients associated with the source image 202.

A quantization unit 206 then quantizes (e.g., divides) the array of coefficients produced by the DCT unit 204 by a quantization parameter such as a quantizer, producing an array of quantized coefficients. For example, high frequency coefficients are generally small and may be quantized to zero, making encoding quantized coefficients as (run, level) pairs more efficient than encoding them symbol by symbol. A plurality of quantization units may be available within the encoder 200.

A scan unit 208 then scans the array of quantized coefficients and converts it into a string of run and level values. Typically, many high frequency coefficients are quantized to zero. By starting in the low frequency corner of the matrix, then zigzagging through the array, the coefficients are combined into a string with the zero-valued ones grouped together.

An entropy encoding unit 210 may then further encode the string, as described in FIG. 1. The resulting bit stream may be outputted into a channel 212. From the channel 212, the bit stream may be transmitted or stored.

The process described above may be reversed in a decoder, where the decoder includes a run-level decoding unit 214, an inverse scan unit 216, an inverse quantization unit 218, and an inverse DCT unit 220. Each unit performs the inverse of its counterpart in the encoder 200, producing a decoded image 222. The inverse quantization unit cannot recover coefficients perfectly because they have been quantized. Therefore, the compression process is lossy. The decoded image 222 is a close approximation of the source image 202.

It will be understood that a plurality of encoders may be available and operating in parallel.

Figure 3:
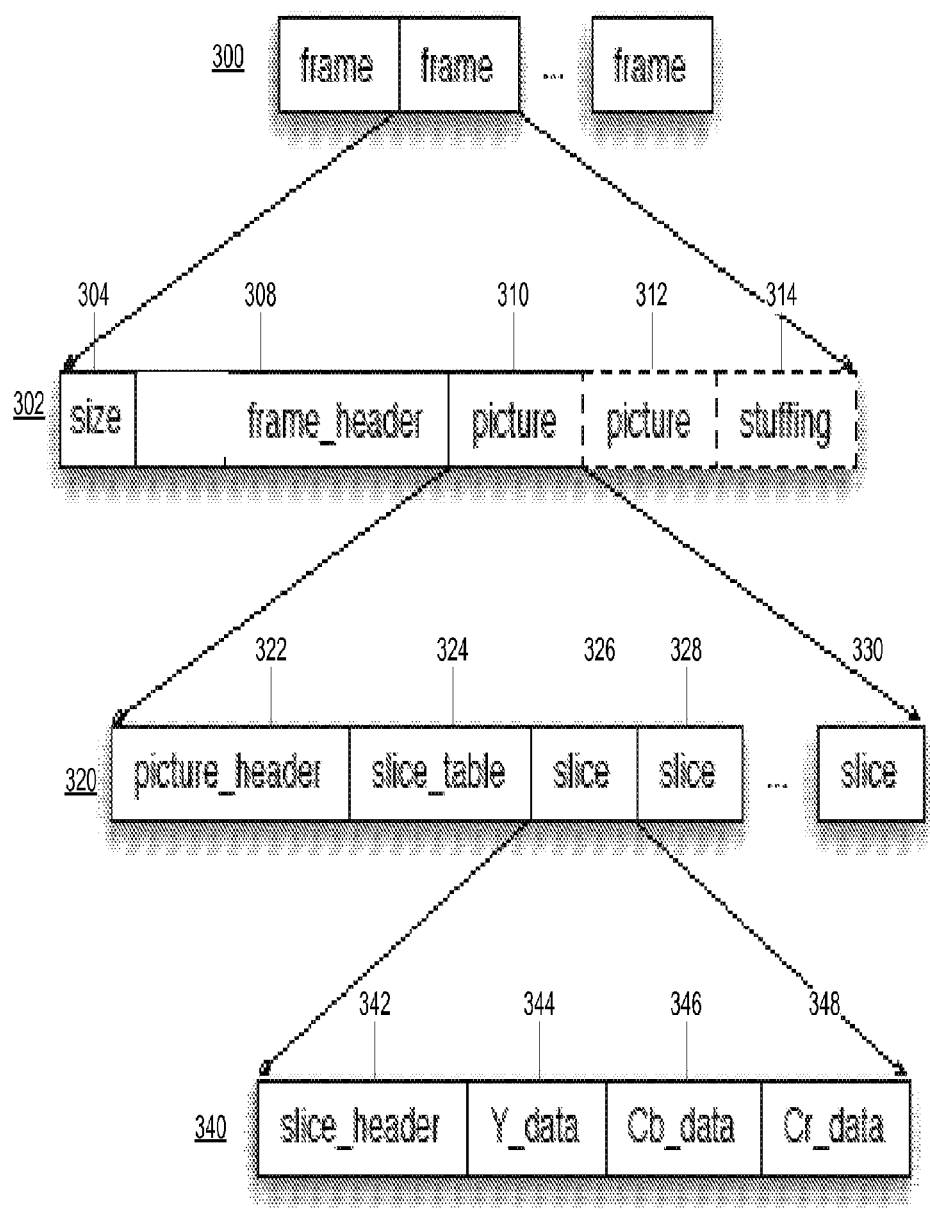
FIG. 3 illustrates a syntax according to an embodiment of the present invention.

FIG. 3 illustrates a syntax according to an embodiment of the present invention. An encoded video 300 may include a sequence of encoded frames.

An encoded frame 302 may include a plurality of fields. A size field 304 indicates the size of the encoded frame in bytes. A frame header field 308 includes header information, such as frame dimension, color information, frame structure, and the like. An encoded picture field 310 includes information sufficient to decode a picture. A second encoded picture field 312, which includes information sufficient to decode a second picture, may be present. Typically a second encoded picture field is only present in an interlaced video frame. A stuffing field 314 may be included to guarantee the frame 302 is of a predetermined size.

An encoded picture 320 may include a plurality of fields. A picture header field 322 includes header information, such as metadata related to the picture. A slice table field 324 may contain a slice table indexing all slices stored in the picture. A plurality of slice fields 326, 328, and 330 may contain individual slices. It will be appreciated that any number of slice fields may be included in the picture 320.

A slice 340 may include a plurality of fields. A slice header field 342 includes header information, such as metadata related to the slice. A Y data field 344 includes luminance information of the slice. A Cb data field 346 includes blue chrominance information of the slice. A Cr data field 348 includes red chrominance information of the slice.

Figure 4:
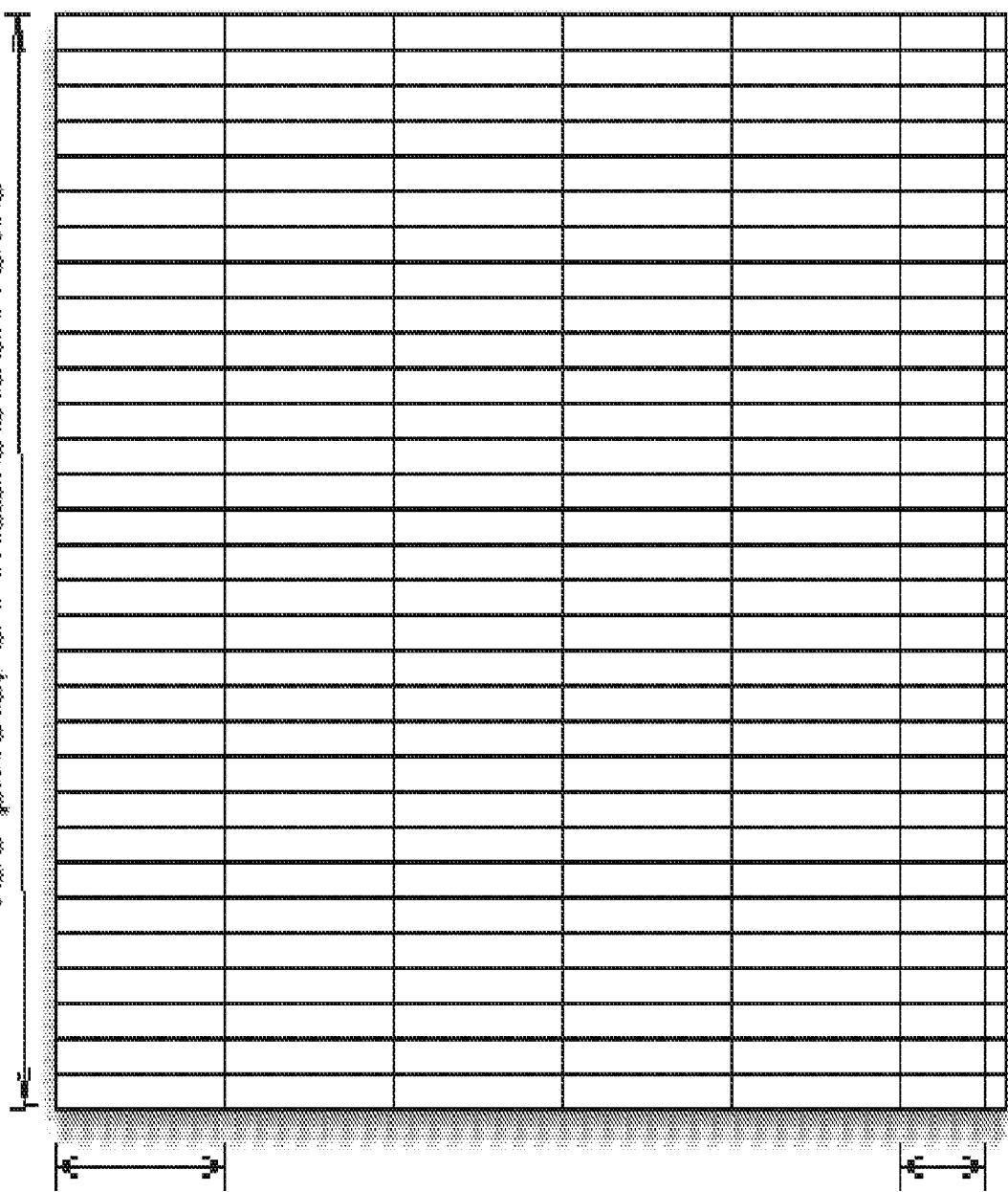
FIG. 4 illustrates a picture division scheme according to an embodiment of the present invention.

FIG. 4 illustrates a picture division scheme according to an embodiment of the present invention. For example, a picture 400 may be 720 pixels horizontally and 486 lines vertically. Each pixel may be associated with display property data (luminance, blue chrominance, and red chrominance).

The picture is further divided into macroblocks, with each macroblock including an array of 16×16 pixels. Any number of macroblocks may be combined into a slice. For example, a plurality of eight macroblocks 42 may be combined into a first slice. Similarly, a plurality of four macroblocks 404 may be combined into a second slice. As described in FIG. 3, a slice may contain display property data of its associated pixels, where the pixels are organized by macroblock. Optionally, macroblock data may be organized into sub-macroblock partitions (e.g., 8×8 blocks) for coding.

Although the preceding text sets forth a detailed description of various embodiments, it should be understood that the legal scope of the invention is defined by the words of the claims set forth below. The detailed description is to be construed as exemplary only and does not describe every possible embodiment of the invention since describing every possible embodiment would be impractical, if not impossible. Numerous alternative embodiments could be implemented, using either current technology or technology developed after the filing date of this patent, which would still fall within the scope of the claims defining the invention.

It should be understood that there exist implementations of other variations and modifications of the invention and its various aspects, as may be readily apparent to those of ordinary skill in the art, and that the invention is not limited by specific embodiments described herein. It is therefore contemplated to cover any and all modifications, variations or equivalents that fall within the scope of the basic underlying principals disclosed and claimed herein.

We claim:

1. A method for encoding an image, comprising:
    generating an array of transform coefficients from pixels of the image;
    quantizing the array of transform coefficients into an array of quantized coefficients;
    converting the array of quantized coefficients into an integer string of run and level values; and
    for each integer in the integer string:
        if an integer is within a first set of integers having a value less than a predetermined threshold value, outputting the integer encoded according to a Golomb-Rice code table associated with the first set of integers; and
        if the integer is within a second set of integers having a value greater than or equal to the predetermined threshold value, outputting the integer encoded according to an exponential Golomb code table associated with the second set of integers.

2. The method of claim 1, wherein the encoded integers are outputted to a channel.

3. The method of claim 1, wherein the threshold value is calculated in part with a last quotient value for which Golomb-Rice code is used and an order of the Golomb-Rice code.

4. The method of claim 1, wherein each Golomb-Rice encoded integer is calculated in part with a quotient and a remainder of the integer with respect to 2 to the power of a Golomb-Rice code order.

5. The method of claim 1, wherein each exponential Golomb encoded integer is calculated in part with a last quotient value for which Golomb-Rice code is used, a quotient, and an order of the exponential Golomb code.

6. The method of claim 1 wherein the transform coefficients are discrete cosine transform coefficients.

7. The method of claim 1 wherein the image is one of a plurality of images comprising a video sequence.

8. A computer-readable medium encoded with a set of instructions which, when performed by a computer, perform a method for encoding an image, said method comprising:
    generating an array of transform coefficients from pixels of the image;
    quantizing the array of transform coefficients into an array of quantized coefficients;
    converting the array of quantized coefficients into an integer string of run and level values; and
    for each integer in the integer string:
        if an integer is within a first set of integers having a value less than a predetermined threshold value, outputting the integer encoded according to a Golomb-Rice code table associated with the first set of integers; and
        if the integer is within a second set of integers having a value greater than or equal to the predetermined threshold value, outputting the integer encoded according to an exponential Golomb code table associated with the second set of integers.

9. The computer-readable medium of claim 8, wherein the encoded integers are outputted to a channel.

10. The computer-readable medium of claim 8, wherein the threshold value is calculated in part with a last quotient value for which Golomb-Rice code is used and an order of the Golomb-Rice code.

11. The computer-readable medium of claim 8, wherein each Golomb-Rice encoded integer is calculated in part with a quotient and a remainder of the integer with respect to 2 to the power of a Golomb-Rice code order.

12. The computer-readable medium of claim 8, wherein each exponential Golomb encoded integer is calculated in part with a last quotient value for which Golomb-Rice code is used, a quotient, and an order of the exponential Golomb code.

13. The computer-readable medium of claim 8 wherein the transform coefficients are discrete cosine transform coefficients.

14. The computer-readable medium of claim 8 wherein the image is one of a plurality of images comprising a video sequence.

15. A system for encoding an image, comprising:
    a transform unit to convert pixels of the image into an array of transform coefficients;
    a quantization unit to quantize the array of transform coefficients into an array of quantized coefficients;
    a scan unit to scan the array of quantized coefficients and generate an integer string of run and level values; and
    an encoder including an entropy encoding unit, the entropy encoding unit configured to, encode each integer from the integer string according to a Golomb-Rice code table if the integer is within a first set of integers having a value less than a predetermined threshold value, and
    encode the integer according to an exponential Golomb code table if the integer is within a second set of integers having a value greater than or equal to the predetermined threshold value.

16. The system of claim 15, wherein each encoded integer is outputted to an output stream.

17. The system of claim 15, wherein the threshold value is calculated in part with a last quotient value for which Golomb-Rice code is used and an order of the Golomb-Rice code.

18. The system of claim 15, wherein each Golomb-Rice encoded integer is calculated in part with a quotient and a remainder of the integer with respect to 2 to the power of a Golomb-Rice code order.

19. The system of claim 15, wherein each exponential Golomb encoded integer is calculated in part with a last quotient value for which Golomb-Rice code is used, a quotient, and an order of the exponential Golomb code.

20. The system of claim 15, wherein the transform coefficients are discrete cosine transform coefficients.

21. The system of claim 15, wherein the image is one of a plurality of images comprising a video sequence.

* * * * *